(12) United States Patent
Miyazawa et al.

(10) Patent No.: US 8,646,879 B2
(45) Date of Patent: Feb. 11, 2014

(54) PIEZOELECTRIC ELEMENT, LIQUID EJECTING HEAD, AND LIQUID EJECTING APPARATUS

(75) Inventors: Hiromu Miyazawa, Azumino (JP); Takayuki Yonemura, Suwa (JP); Koichi Morozumi, Shiojiri (JP); Tomohiro Sakai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/353,177

(22) Filed: Jan. 18, 2012

(65) Prior Publication Data

US 2012/0182358 A1  Jul. 19, 2012

(30) Foreign Application Priority Data

Jan. 19, 2011 (JP) .................................. 2011-009279
Dec. 20, 2011 (JP) .................................. 2011-278861

(51) Int. Cl.
*B41J 2/045* (2006.01)
*C04B 35/495* (2006.01)
*H01L 41/18* (2006.01)
*H01L 41/187* (2006.01)
*C04B 35/00* (2006.01)

(52) U.S. Cl.
USPC .................. 347/68; 252/62.9 R; 252/62.9 PZ

(58) Field of Classification Search
USPC .......................... 347/68; 252/62.9 R, 62.9 PZ
See application file for complete search history.

(56) References Cited

U.S. PATENT DOCUMENTS

| 7,586,234 B2 * | 9/2009 | Miyazawa et al. ............. 310/311 |
| 2005/0213020 A1 * | 9/2005 | Takeda et al. ................. 349/182 |
| 2010/0308692 A1 * | 12/2010 | Kobayashi et al. ........... 310/339 |
| 2011/0074249 A1 * | 3/2011 | Sakashita et al. ............. 310/339 |

FOREIGN PATENT DOCUMENTS

JP  2001-223404  8/2001

\* cited by examiner

*Primary Examiner* — Lisa M Solomon
(74) *Attorney, Agent, or Firm* — Workman Nydegger

(57) ABSTRACT

A piezoelectric element comprises a piezoelectric layer and an electrode which is provided with the piezoelectric layer. The piezoelectric layer comprises a complex oxide which has a perovskite structure including bismuth, iron, a first dopant element which is at least one type selected from a group formed from sodium, potassium, calcium, and strontium, and a second dopant element which is at least one type selected from a group formed from manganese, titanium, vanadium, niobium, and tin.

4 Claims, 16 Drawing Sheets

BiFeO$_3$

BiFeO$_3$ + Bi_defect

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2011-009279, filed Jan. 19, 2011 and Japanese Patent Application No. 2011-278861, filed Dec. 20, 2011 are expressly incorporated by reference.

BACKGROUND

1. Technical Field

The present invention relates to a liquid ejecting head and a liquid ejecting apparatus, which are provided with a piezoelectric element which has a piezoelectric layer and an electrode through which a voltage is applied to the piezoelectric layer, and a piezoelectric element.

2. Related Art

As a piezoelectric actuator which is used in a liquid ejecting head, a piezoelectric element is used which is configured by a piezoelectric material which exhibits an electromechanical conversion function, for example, a piezoelectric layer formed from a crystalline dielectric material, being interposed between two electrodes. As a representative example of a liquid ejecting head, for example, there is an ink jet recording head where a portion of a pressure generating chamber which communicates with a nozzle opening which discharges ink droplets is configured of a vibrating plate and ink droplets are discharged from the nozzle opening by pressure being applied to the ink in the pressure chamber due to the vibrating plate being deformed by the piezoelectric element.

Strong piezoelectric characteristics are demanded in the piezoelectric material which is used as the piezoelectric layer (piezoelectric ceramics) which configures the piezoelectric element in this manner, and as a representative example, there is lead zirconate titanate (PZT) (refer to JP-A-2001-223404).

However, from a point of view of environmental problems, a piezoelectric material, where the amount of lead contained is suppressed, is being demanded. As a piezoelectric material which does not contain lead, for example, there are $BiFeO_3$ and the like which have a perovskite structure expressed by $ABO_3$. Here, the A and B in $ABO_3$ indicate an A site and a B site and are sites where oxygen has a coordination number of 12 and a coordination number of 6 respectively. However, there is a problem that with the $BiFeO_3$-based piezoelectric material, insulation is low and leak currents are easily generated. When leak currents are easily generated, there is a problem that it is difficult to use in the liquid ejecting head since a problem tends to occur such as cracks being easily generated in particular when used in a state where high voltages are applied. As such, in the piezoelectric material used in the piezoelectric element, high insulation of $1\times10^{-3}$ $A/cm^2$ or less is demanded, for example, during application of 25 V which is a representative driving voltage.

Here, the problems such as these do not only exist in the ink jet recording heads, but of course, also in the same manner in other liquid ejecting heads which discharge liquid droplets other than ink, and also exist in the same manner in piezoelectric elements which are not used in liquid ejecting heads. Furthermore, the problem of leak currents occurs as a serious problem in the form of increased energy consumption when the piezoelectric element is used as a sensor. For example, it is preferable that leak currents also be low in piezoelectric elements which are used in piezoelectric sensors, infrared sensors, heat sensors, and pyroelectric sensors which are used with an applied voltage of 1 V or less.

SUMMARY

An advantage of some aspects of the invention is that a liquid ejecting head and a liquid ejecting apparatus, which reduce burden on the environment, have high insulation, and suppress leak current, and a piezoelectric element are provided.

According to an aspect of the invention, there is a liquid ejecting head which is provided with a pressure generating chamber which communicates with a nozzle opening and a piezoelectric element which is provided with a piezoelectric layer and an electrode which is provided on the piezoelectric layer, in which the piezoelectric layer is formed from a complex oxide which has a perovskite structure which includes bismuth and iron and includes a first dopant element which is at least one type selected from a group formed from sodium, potassium, calcium, and strontium and a second dopant element which is at least one type selected from a group formed from manganese, titanium, vanadium, niobium, and tin.

In this configuration, a piezoelectric element with high insulation which suppresses leak current is possible with superior durability. In addition, it is possible to reduce the burden on the environment since lead is not contained therein.

Here, it is preferable that the bismuth and the first dopant element be included in an A site and the iron and the second dopant element be included in a B site.

In addition, it is preferable that the complex oxide have an A site-deficient perovskite structure and has bismuth in the B site.

In addition, it is preferable that the complex oxide further include barium titanate in addition to bismuth and iron. According to this, the liquid ejecting head has a piezoelectric element which has stronger piezoelectric characteristics (strain amount).

According to another aspect of the invention, there is a liquid ejecting apparatus which is installed with the liquid ejecting head described above.

In this configuration, it is possible to realize the liquid ejecting apparatus which is installed with a piezoelectric element with superior insulation which suppresses leak current and has superior durability. In addition, it is possible to reduce the burden on the environment since lead is not contained therein.

According to still another aspect of the invention, there is a piezoelectric element which is provided with a piezoelectric layer and an electrode which is provided with the piezoelectric layer, where the piezoelectric layer is formed from a complex oxide which has a perovskite structure which includes bismuth and iron and includes a first dopant element which is at least one type selected from a group formed from sodium, potassium, calcium, and strontium and a second dopant element which is at least one type selected from a group formed from manganese, titanium, vanadium, niobium, and tin.

In this configuration, it is possible to realize the piezoelectric element with superior insulation which suppresses leak current. In addition, it is possible to reduce the burden on the environment since lead is not contained therein.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
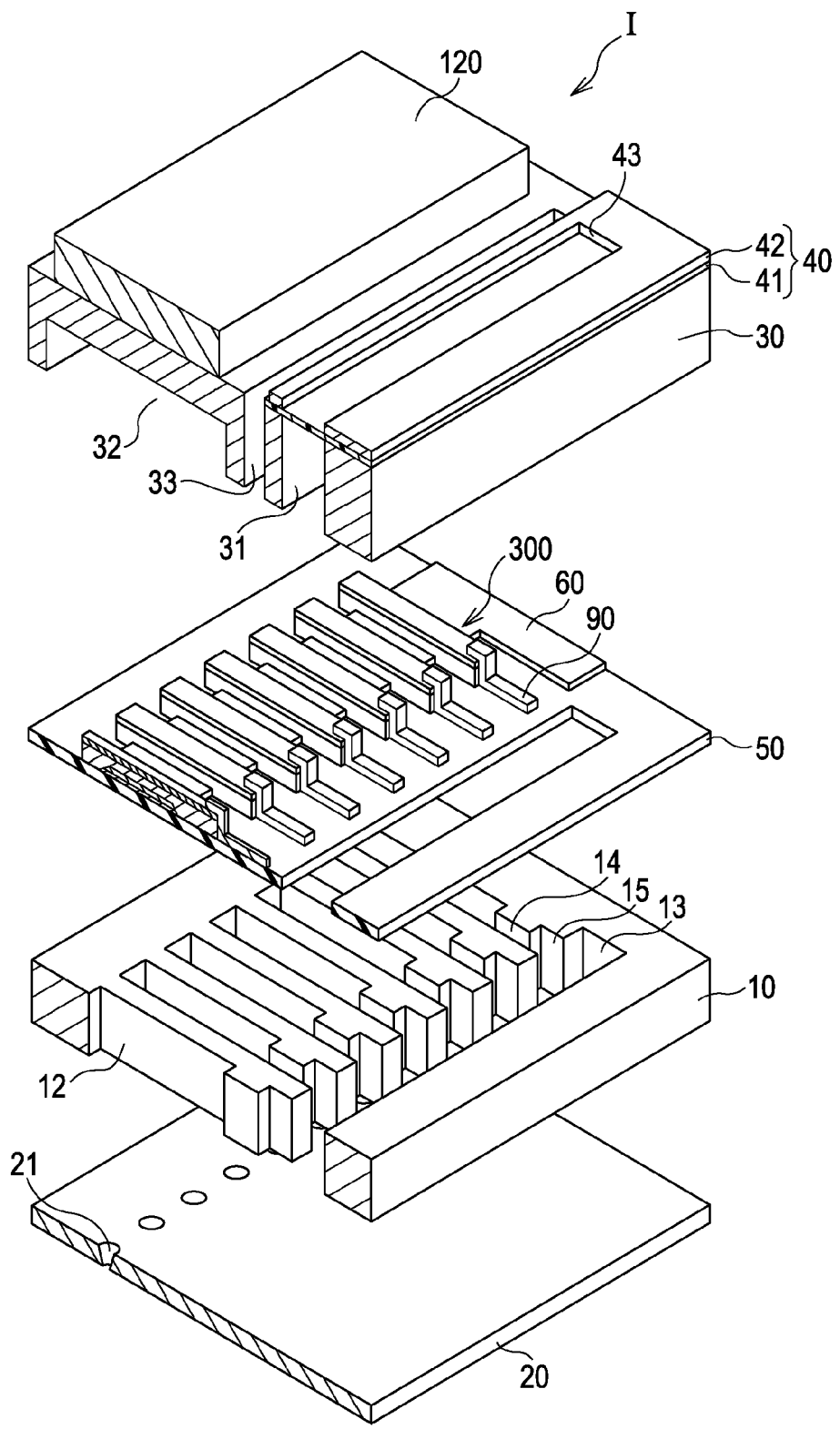
FIG. 1 is an exploded perspective diagram illustrating an outline configuration of a recording head according to a first embodiment.
Figure 2:
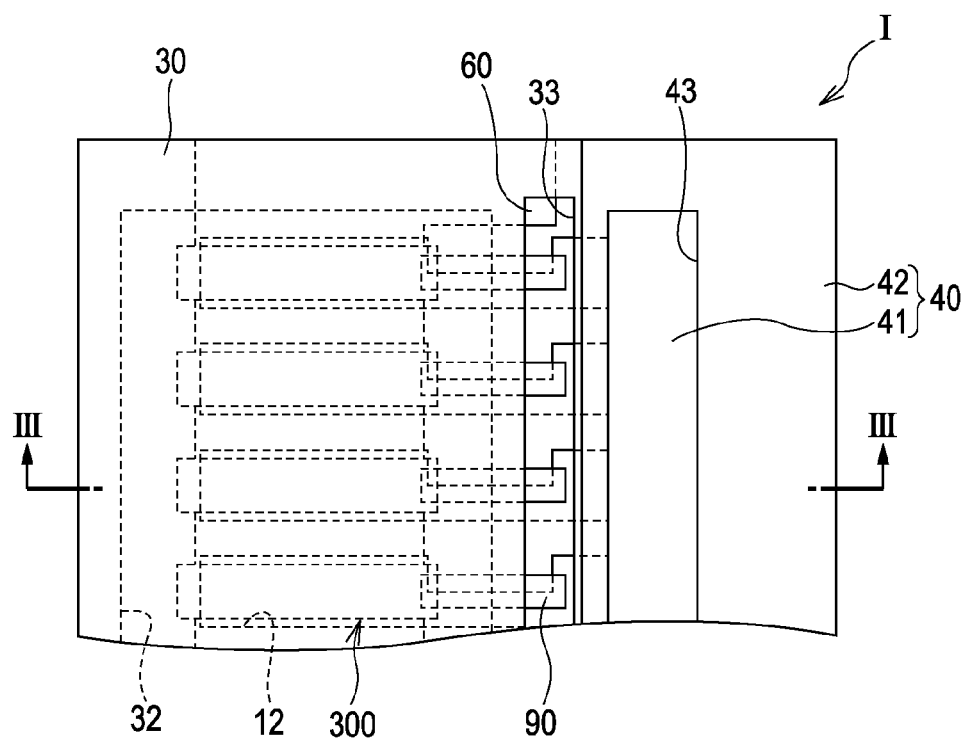
FIG. 2 is a planar diagram of a recording head according to the first embodiment.
Figure 3:
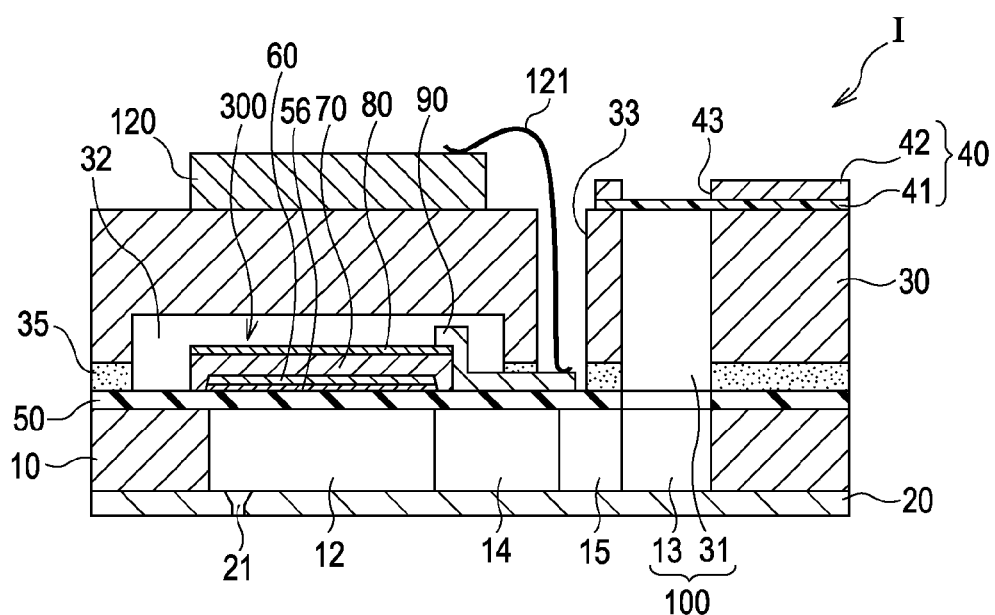
FIG. 3 is a cross-sectional diagram of a recording head according to the first embodiment.

FIG. 1 is an exploded perspective diagram illustrating an outline configuration of an ink jet recording head which is an example of a recording head according to a first embodiment of the invention, FIG. 2 is a planar diagram of FIG. 1, and FIG. 3 is a cross-sectional diagram of a line III-III in FIG. 2. As shown in FIGS. 1 to 3, a flow path forming substrate 10 of the embodiment is formed from a silicon single crystal substrate, and on one surface thereof, a flexible film 50 formed from silicon dioxide is formed.

A plurality of pressure generating chambers 12 are lined up in a width direction in the flow path forming substrate 10. In addition, a communication section 13 is formed in a region on an outer side in the longitudinal direction of the pressure generating chamber 12 of the flow path forming substrate 10, and the communication section 13 and each of the pressure generating chambers 12 communicate via an ink supply path 14 and a communication path 15 which are provided for each of the pressure generating chambers 12. The communication section 13 configures a portion of a manifold which communicates with a manifold section 31 in a protection substrate which will be described later and is an ink chamber which is common to each of the pressure generating chambers 12. The ink supply path 14 is formed with a width which is narrower than the pressure generating chamber 12 and maintains a constant flow path resistance with regard to ink which flows into the pressure generating chamber 12 from the communication section 13. Here, in the embodiment, the ink supply path 14 is formed by restricting the width of the flow path from one side, but the ink supply path may be formed by restricting the width of the flow path from both sides. In addition, the ink supply path may be formed by restricting from a thickness direction instead of the width of the flow path. In the embodiment, a liquid flow path which is formed from the pressure generating chamber 12, the communication section 13, the ink flow path section 14, and the communication path 15 is provided in the flow path forming substrate 10.

In addition, a nozzle plate 20 where a nozzle opening 21, which communicates with a vicinity of an edge portion on a side opposite to the ink supply path 14 of each of the pressure generating chambers 12, is provided is fixed using an adhesive agent or a thermal bonding film on an opening surface side of the flow path forming substrate 10. Here, the nozzle plate 20 is formed from, for example, glass ceramics, a silicon single crystal substrate, or stainless steel.

On the other hand, the elastic film 50 such as that described above is formed on a side opposite to the opening surface of the flow path forming substrate 10, and on the elastic film 50, an adhesive layer 56, which is, for example, formed from titanium oxide or the like with a thickness of approximately 30 to 50 nm, is provided for improving the adhesion of a foundation of a first electrode 60 to the elastic film 50 and the like. Here, an insulation film which is formed from zirconium oxide may be provided as required on the elastic film 50.

Furthermore, a piezoelectric element 300 is configured by a first electrode 60, a piezoelectric layer 70 which is a thin film with a thickness of 2 μm or less and preferably 0.3 to 1.5 μm, and a second electrode 80 being laminated and formed on the adhesive layer 56. Here, the piezoelectric element 300 has sections including the first electrode 60, the piezoelectric layer 70, and the second electrode 80. Typically, any one of the electrodes of the piezoelectric element 300 is set as a common electrode and the other electrode and the piezoelectric layer 70 are configured by being patterned for each of the pressure generating chambers 12. In the embodiment, the first electrode 60 is set as the common electrode of the piezoelectric element 300 and the second electrode 80 is set as the individual electrodes of the piezoelectric element 300, but there is no impediment to reversing this for the sake of a driving circuit or wiring. In addition, here, the combination of the piezoelectric element 300 and the vibrating plate where a change in position is generated due to the driving of the piezoelectric element 300 is referred to as an actuator device. Here, in the example described above, the elastic film 50, the adhesive layer 56, the first electrode 60, and the insulation film which is provided as required act as the vibrating plate, but of course, the invention is not limited to this, and for example, the elastic film 50 and the adhesive layer 56 may not be provided. In addition, the piezoelectric element 300 itself may double in use as the vibrating plate in practice.

Below, the perovskite structure of the complex oxide which includes a transition metal is expressed by $ABO_3$. Here, the A site and the B site indicate sites where oxygen has respectively a coordination number of 12 and a coordination number of 6.

In the embodiment, the piezoelectric layer 70 is formed from a complex oxide which has a perovskite structure which includes bismuth (Bi) and iron (Fe) and includes a first dopant element which is at least one type selected from a group formed from sodium (Na), potassium (K), calcium (Ca), and strontium (Sr) and a second dopant element which is at least one type selected from a group formed from manganese (Mn), titanium (Ti), vanadium (V), niobium (Nb), and tin (Sn). Due to this, as described later, suppressing of leak current and superior insulation is possible. In addition, it is possible to reduce the burden on the environment since lead is not contained therein.

As the complex oxide according to the invention, there is a perovskite structure with bismuth included at the A site and iron included at the B site, but other elements may be included by replacing bismuth and iron respectively at the A site and the B site. For example, it is possible to have lanthanum, praseodymium, neodymium, samarium, yttrium, or the like as the replacement element in the A site and cobalt, chromium, manganese, nickel, copper, or the like as the replacement element in the B site.

There is a problem that bismuth included in $BiFeO_3$ and the like is easily volatized in the manufacturing process, and in particular, in the baking process of the piezoelectric layer and it is easy for deficiencies in the crystalline structure to occur at the site A. The Bi which is lost is dispersed in the atmosphere of the manufacturing chamber and in the lower electrode side. At the same time as the Bi being removed from the system, oxygen for maintaining the balance in the number of electrons is deficient. The proportion of Bi deficiency to oxygen deficiency is 2:3 in order to satisfy the principle of charge neutrality. The existence of the oxygen deficiency itself narrows the band gap of the piezoelectric element by lowering the orbital energy of a d electron of the transition metal via the Coulomb potential, and as a result, is a direct cause of leak current being generated. In order to suppress the oxygen deficiency, it is sufficient to suppress the Bi deficiency. As a means of doing this, a method is considered where Bi is excessively input in advance with regard to the stoichiometric composition. However, the excess Bi enters not only the A sites but also unintentionally the B sites in a constant proportion. The Bi which has entered the B sites becomes a supplier of electron carriers and there is a problem that leak current occurs in the piezoelectric element. As a result, in the system of $BiFeO_3$, it is not possible to have a manufacturing method where excessive Bi is input with regard to the stoichiometric composition.

Figure 7:
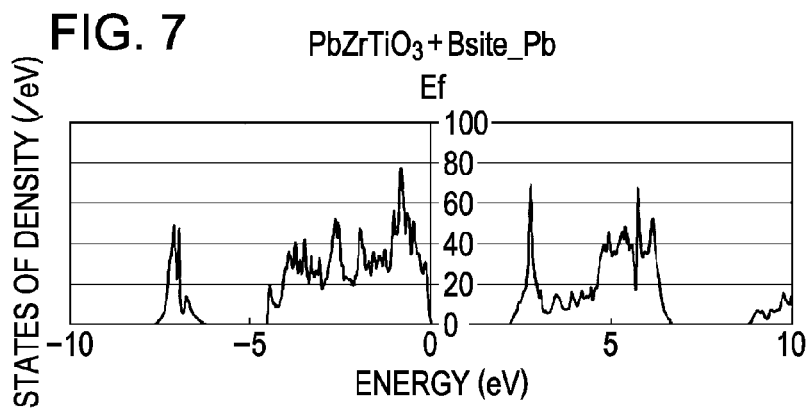
FIG. 7 is a diagram illustrating an electron density of a state in which 12.5% of a transition metal in B sites in $PbZrTiO_3$ is replaced with Pb.

Here, in lead zirconate titanate ($PbZrTiO_3$:PZT) which is a material in the related art, it is easy for lead (Pb) to be volatized in the manufacturing process in the same manner as Bi. As a result, a method is taken where Pb is excessively input in advance with regard to the stoichiometric composition. The excess Pb causes a phenomenon where the Pb unintentionally enters the B sites. However, in PZT, as shown in FIG. 7 which will be described later, it is possible to maintain the band gap in the electron structure even when the Pb is unintentionally included in the B sites. Accordingly, in a case of manufacturing $PbZrTiO_3$, insulation of a piezoelectric body is not lost even with the method where Pb is excessively input in advance with regard to the stoichiometric composition.

As a result of these problems being further investigated using a first principle electronic state calculation, the following knowledge was obtained.

FIGS. 4 to 8 are diagrams illustrating an electron density of a state of each crystal determined using an electronic state calculation from first principles, where the horizontal axis is electron energy difference (eV) and the vertical axis is the density of a state (DOS) of the electron. In addition, to the positive side of state density 0 (/eV) indicates up spin and to the negative side indicates down spin. As the conditions of the first principle electronic state calculation, an ultrasoft pseudopotential based on a density functional method in a range of a generalized gradient approximation (GGA) which has been generalized is used. With regard to the transition metal electrons of the B site, a GGA plus U method is applied for inputting the strong correlation effect from the localization of the d electron orbits. The cutoff of the wave function and the cutoff of the charge density are respectively 20 hartrees and 360 hartrees. The super cell of the crystals which are used in the calculation are configured using 2×2×2=8 perovskite structures of the $ABO_3$ type. In addition, the mesh of the inverse lattice point (k point) is (4×4×4).

Figure 4:
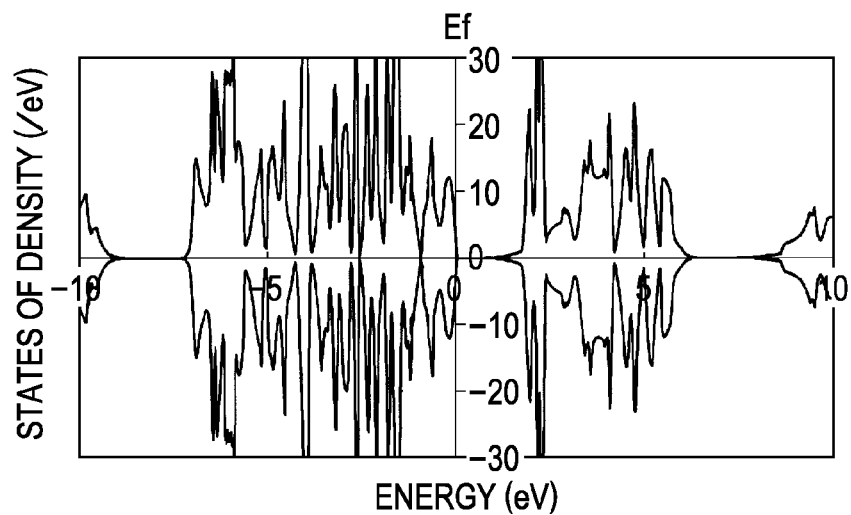
FIG. 4 is a diagram illustrating an electron density of a state of completely crystalline $BiFeO_3$.
Figure 5:
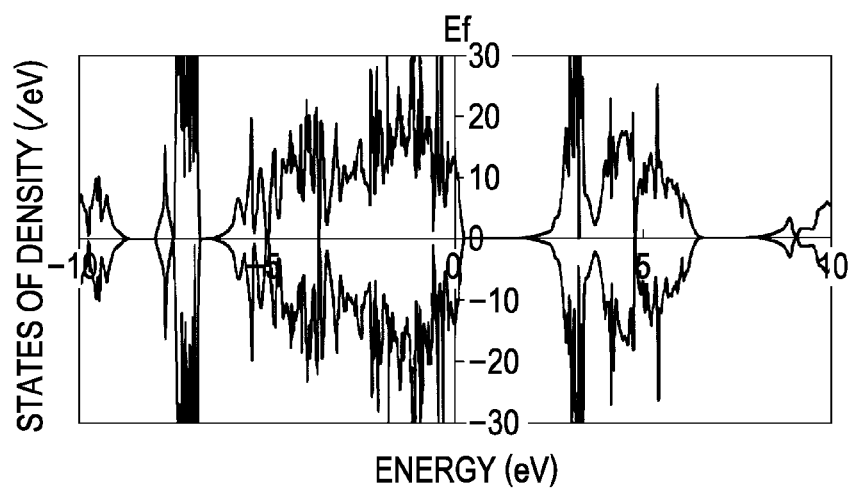
FIG. 5 is a diagram illustrating an electron density of a state of a 12.5% deficiency in Bi in A sites in $BiFeO_3$.
Figure 6:
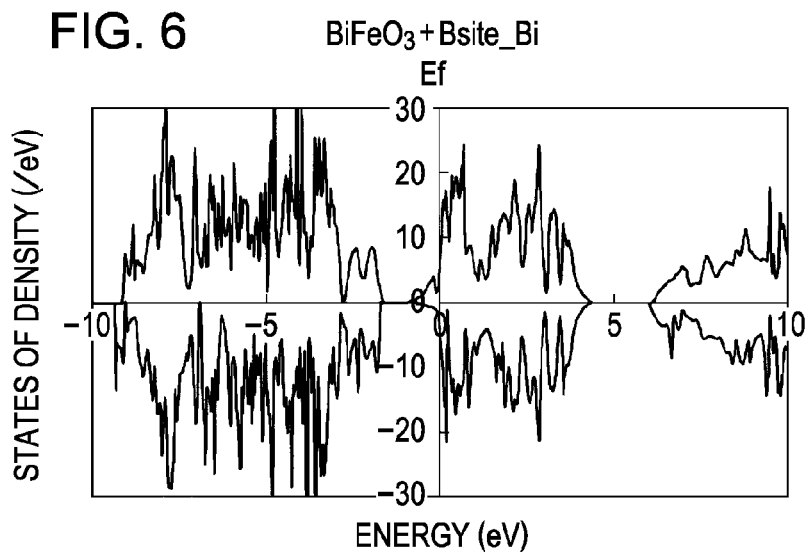
FIG. 6 is a diagram illustrating an electron density of a state in which 12.5% of iron in B sites in $BiFeO_3$ is replaced with Bi.
Figure 8:
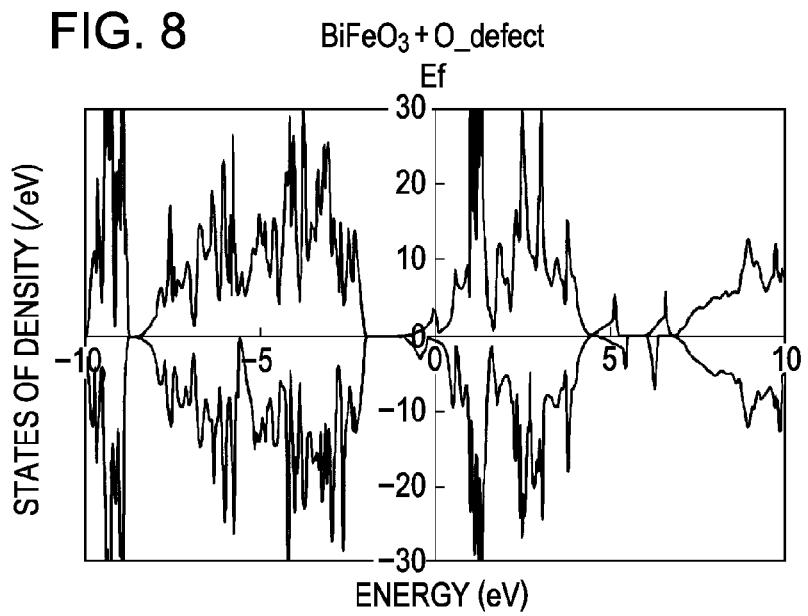
FIG. 8 is a diagram illustrating an electron density of a state when there is oxygen deficiency of 4% in an oxygen site in $BiFeO_3$.

FIG. 4 is a diagram illustrating an electron density of a state of completely crystalline bismuth ferrate ($BiFeO_3$), FIG. 5 is a diagram illustrating an electron density of state of a 12.5% deficiency in Bi in A sites in bismuth ferrate ($BiFeO_3$), FIG. 6 is a diagram illustrating an electron density of state in which 12.5% of Bi is included in B sites in bismuth ferrate ($BiFeO_3$), FIG. 7 is a diagram illustrating an electron density of a state in which 12.5% of a transition metal in B sites in $PbZrTiO_3$ is replaced with Pb, and FIG. 8 is a diagram illustrating an electron density of a state in a case where there is 4% deficiency in oxygen sites in bismuth ferrate ($BiFeO_3$).

In the system, the antiferromagnetic state is stable in any of the cases of FIGS. 4, 5, 6, and 8.

As shown in FIG. 4, in a case of completely crystalline $BiFeO_3$, that is, in a case where there are no vacancies in the respective sites and there is no replacement using elements other than Bi, the maximum electron occupancy level (Ef) is the top of the valence band and the insulating band gap is opened. In FIG. 4, the state on the side where energy is low with regard to the band gap is the valence band and the state on the side where the energy is high is a conduction band.

Here, the maximum electron occupation level indicates a maximum orbiting energy level which the electron occupies with regard to one electron energy which is obtained using electron state simulation. In each of the graphs of electron density of a state, the origin on the horizontal axis is the maximum electron occupation level (Ef).

As shown in FIG. 5, in $BiFeO_3$, when there is a deficiency due to a portion of the bismuth (Bi) in the A sites being deficient, an empty state density appears more to the positive side than energy 0 eV. That is, the maximum electron occupation level enters the valence band energy region. Accordingly, in the system, it is understood that there is no insulation, hole carriers are generated, and there is a p-type as the electrical conduction type. At this time, by determining the area of the empty state density, it is understood that the Bi deficiency at the A site is given three hole carriers.

In addition, as shown in FIG. 6, when bismuth (Bi) is included in the B sites, a state density appears in which there is more occupation to the negative side than 0 eV. That is, the maximum electron occupation level enters the conduction band energy region. Accordingly, in the system, it is understood that there is no insulation, electron carriers are generated, and there is an n-type as the electrical conduction type. By determining the area of the state density which is occupied at this time, it is understood that the Bi at the B site is given two electron carriers. As a result, the using of excessive Bi as the input composition in the manufacturing process brings electron carriers into the system and is not preferable in terms of leak characteristics.

FIG. 7 illustrates an electron density of a state in which 12.5% of a transition metal in B sites in $PbZrTiO_3$ is replaced with Pb. In the PZT-based piezoelectric material with, since it is possible to maintain a band gap in the electron configuration as shown in FIG. 7 even if Pb is unintentionally included in the B site, the insulation of a piezoelectric body is not lost even if a method is taken where Pb is excessively input in advance with regard to the stoichiometric composition in a case of manufacturing $PbZrTiO_3$.

In addition, as shown in FIG. 8, when there is 4% deficiency in an oxygen site in $BiFeO_3$, a state density appears in which there is more occupation to the negative side than 0 eV. That is, the maximum electron occupation level enters the conduction band energy region. Accordingly, in the system, it is understood that there is no insulation, electron carriers are generated, and there is an n-type as the electrical conduction type. By determining the area of the state density which is occupied at this time, it is understood that the deficiency at the oxygen site is given two electron carriers.

Accordingly, as shown in FIGS. 5, 6, and 8, an n-type deficiency and a p-type deficiency coexists in $BiFeO_3$. For example, in a case of a semiconductor, since the electron state of a carrier in the conduction band and the valence band are like free electrons, the hole carrier which come from the p-type deficiency and the electron carrier which come from the n-type deficiency spread in a spatial manner and it is possible to cancel each other out. On the other hand, in a case of an oxide with a transition metal, the carriers in the conduction band and the valence band are localized and mobility is low. As a result, the cancelling out of the hole carriers and the electron carriers is not complete. As a result, in an oxide with a transition metal, the carriers which are not able to cancel out each other contribute to electric conductance of the system as hopping conduction.

Figure 9:
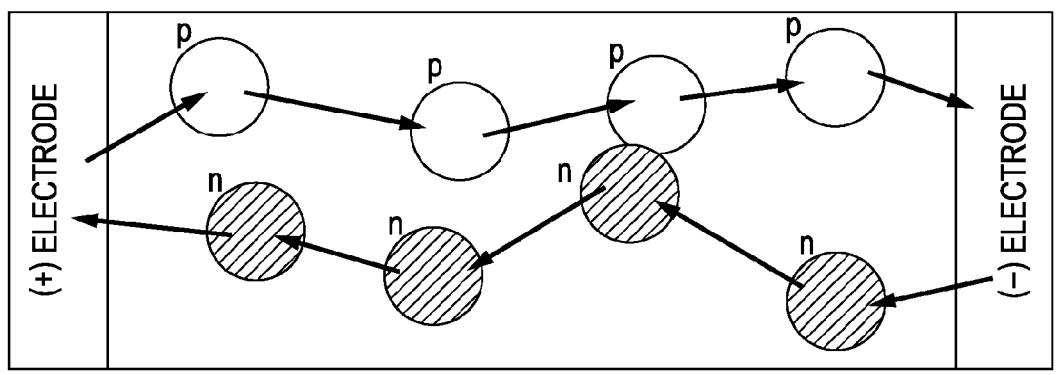
FIG. 9 is a schematic diagram describing a hopping conduction in crystals of a complex oxide.

FIG. 9 schematically illustrates a state of hopping conduction in a transition metal compound where there is the p-type deficiency and the n-type deficiency. In this manner, in the transition metal compound, a hopping conductance channel, where movement of the hole carriers and the electron carriers are respectively generated in the respective p-type deficiency and n-type deficiency, is formed. In a state such as this, even if doping was performed to compensate for one of the carriers, it is not possible to suppress the hopping conductance due to the other carrier. This is thought to be a reason that it is not possible to improve insulation in $BiFeO_3$.

As such, even with doping with an n-type dopant element which cancels out the p-type deficiency or a p-type dopant element which cancels out the n-type deficiency, it is not possible to prevent the generating of leak current, but when doping (co-doping) with an n-type dopant element and a p-type dopant element at the same time, it is possible to suppress the leak current due to the p-type deficiency and the leak current based on the n-type deficiency.

The invention is based on this knowledge, and dopes (co-dopes) a complex oxide which is a transition metal compound such as $BiFeO_3$ with an n-type dopant element and a p-type dopant element at the same time, prevents leak current due to the p-type deficiency and the leaking based on the n-type deficiency, and improves insulation.

Figure 10:
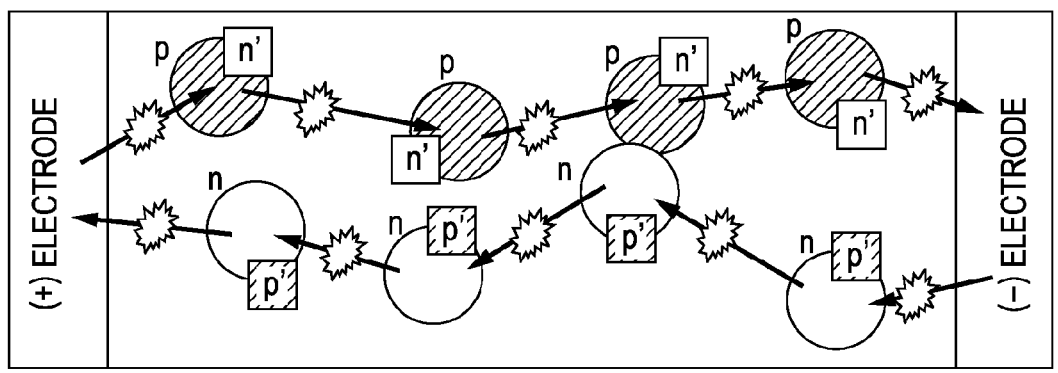
FIG. 10 is a schematic diagram describing a hopping conduction in crystals of a complex oxide of the invention.
Figure 11:
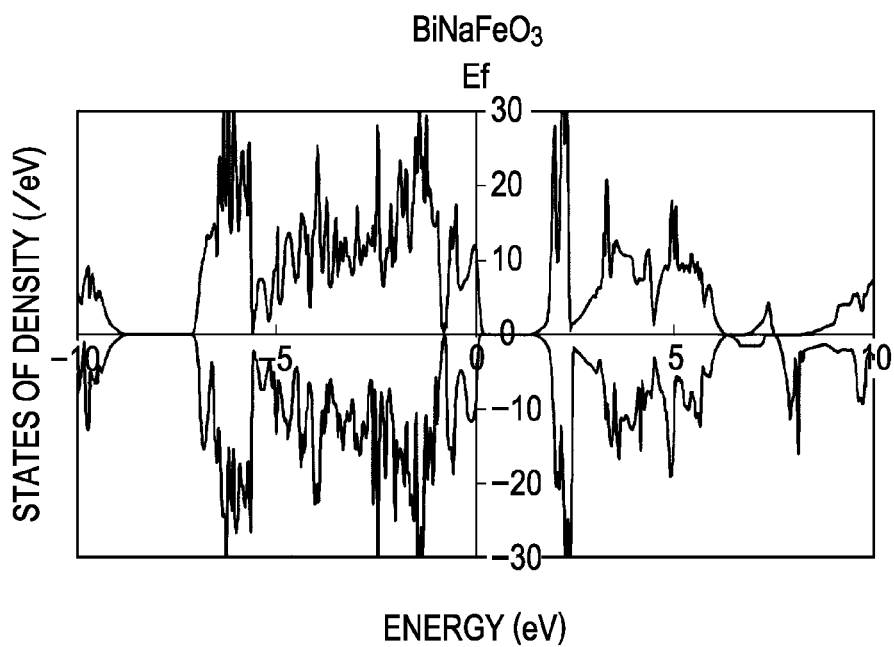
FIG. 11 is a diagram illustrating an electron density of a state when 12.5% of Bi in A sites in $BiFeO_3$ is replaced with Na.
Figure 12:
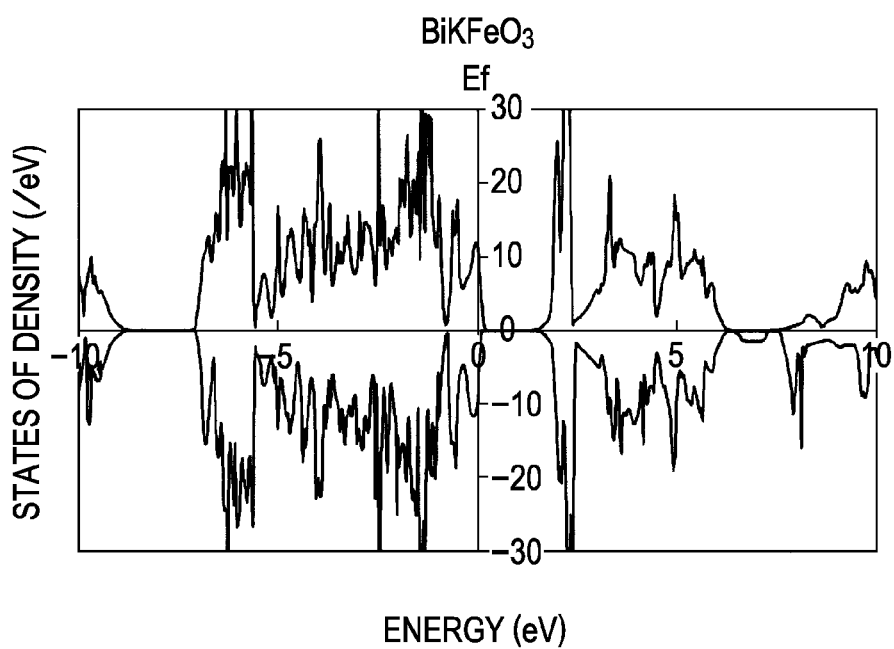
FIG. 12 is a diagram illustrating an electron density of a state when 12.5% of Bi in A sites in $BiFeO_3$ is replaced with K.
Figure 13:
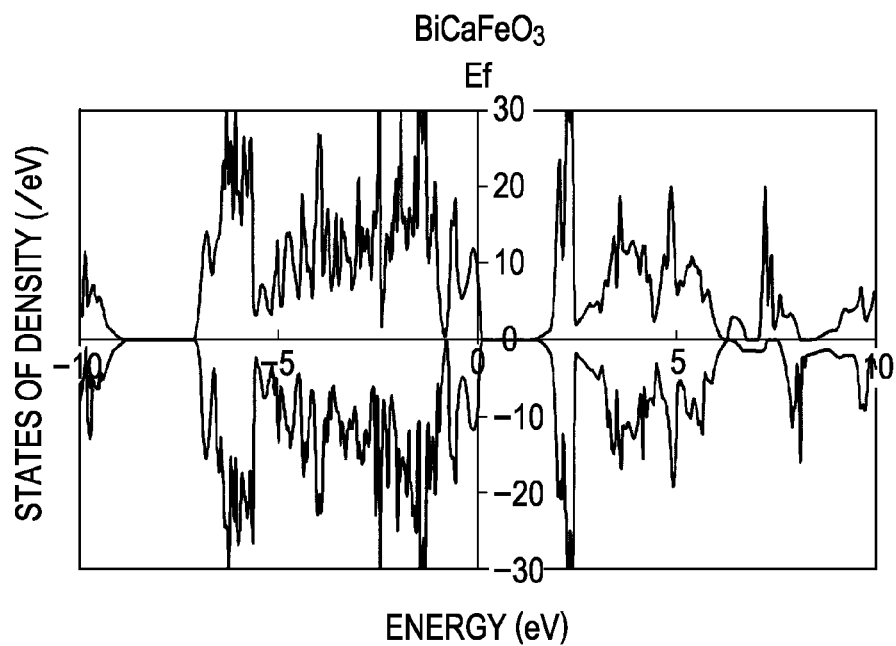
FIG. 13 is a diagram illustrating an electron density of a state when 12.5% of Bi in A sites in $BiFeO_3$ is replaced with Ca.
Figure 14:
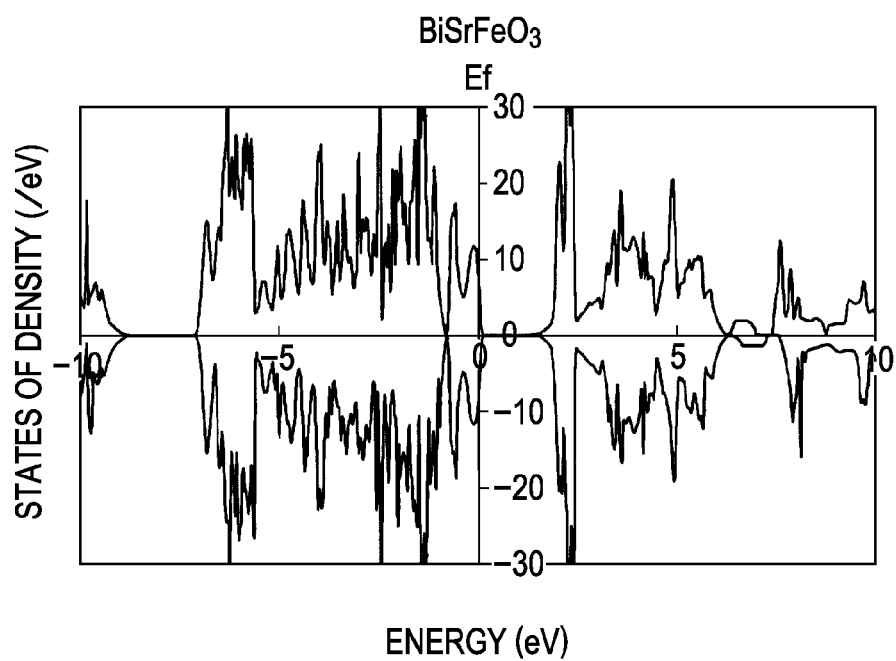
FIG. 14 is a diagram illustrating an electron density of a state when 12.5% of Bi in A sites in $BiFeO_3$ is replaced with Sr.
Figure 15:
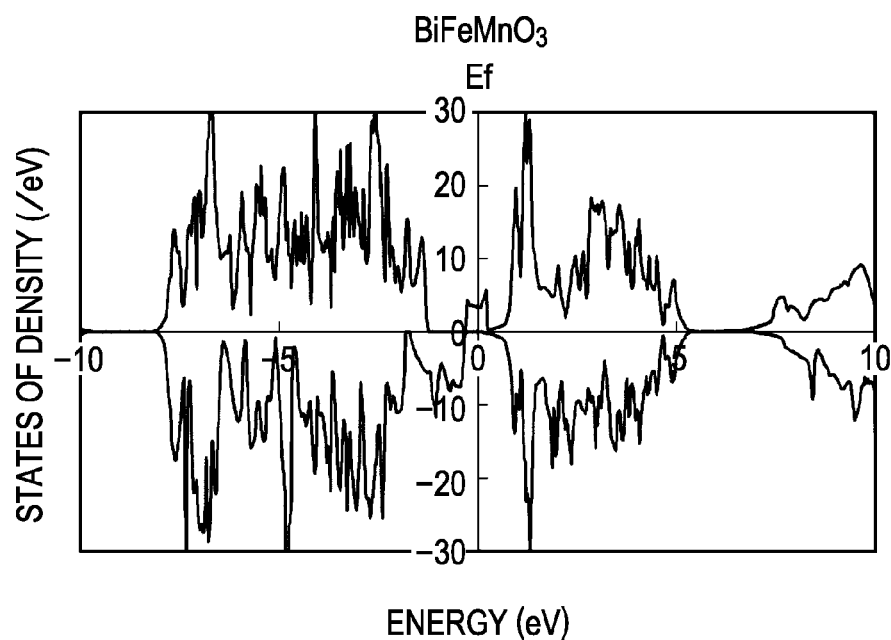
FIG. 15 is a diagram illustrating an electron density of a state when 12.5% of Fe in B sites in $BiFeO_3$ is replaced with Mn.
Figure 16:
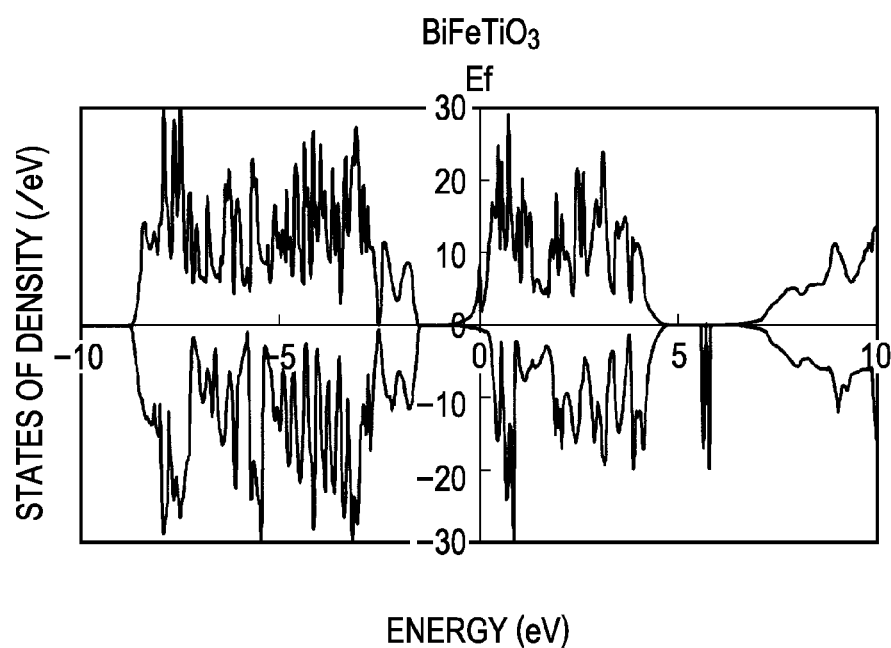
FIG. 16 is a diagram illustrating an electron density of a state when 12.5% of Fe in B sites in $BiFeO_3$ is replaced with Ti.
Figure 17:
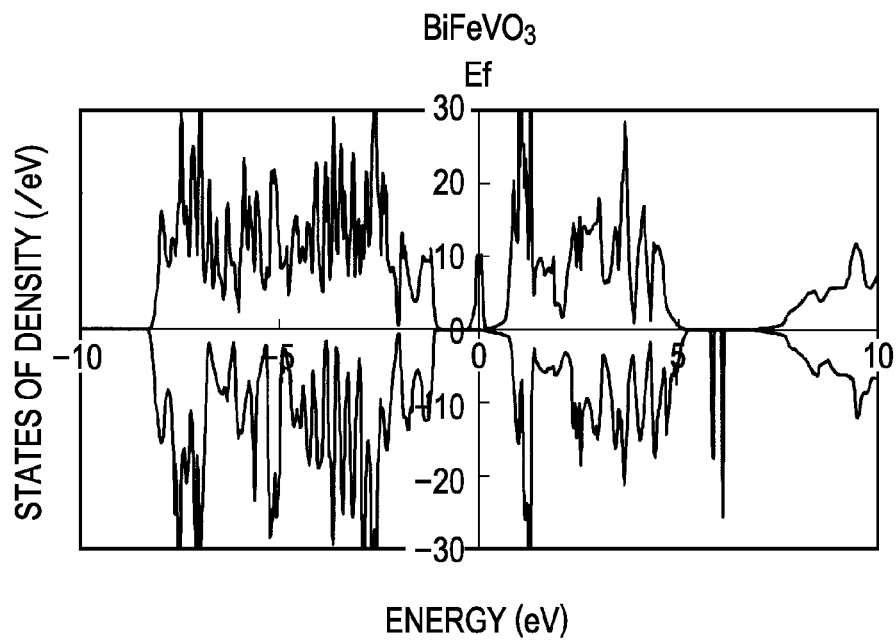
FIG. 17 is a diagram illustrating an electron density of a state when 12.5% of Fe in B sites in $BiFeO_3$ is replaced with V.
Figure 18:
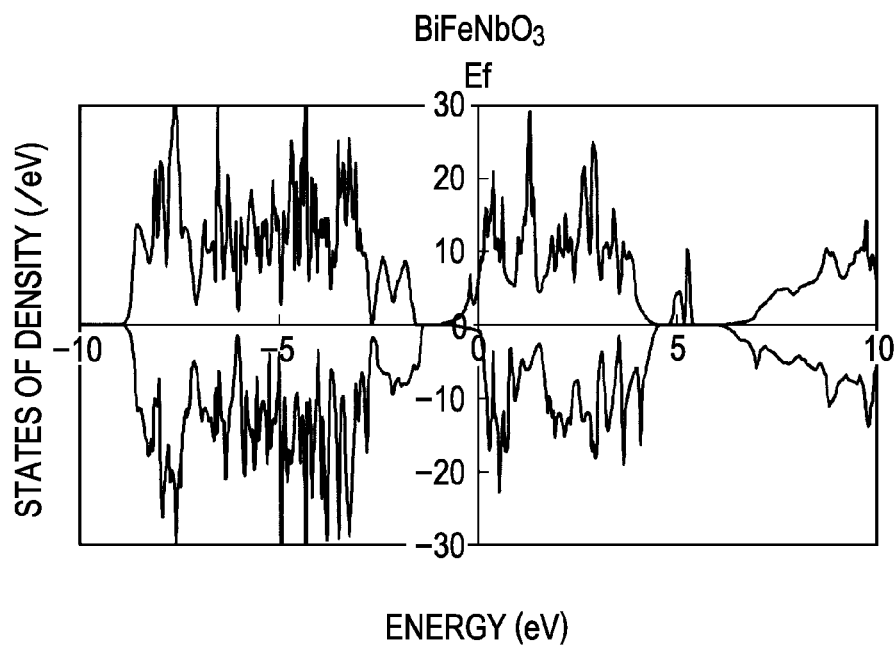
FIG. 18 is a diagram illustrating an electron density of a state when 12.5% of Fe in B sites in $BiFeO_3$ is replaced with Nb.
Figure 19:
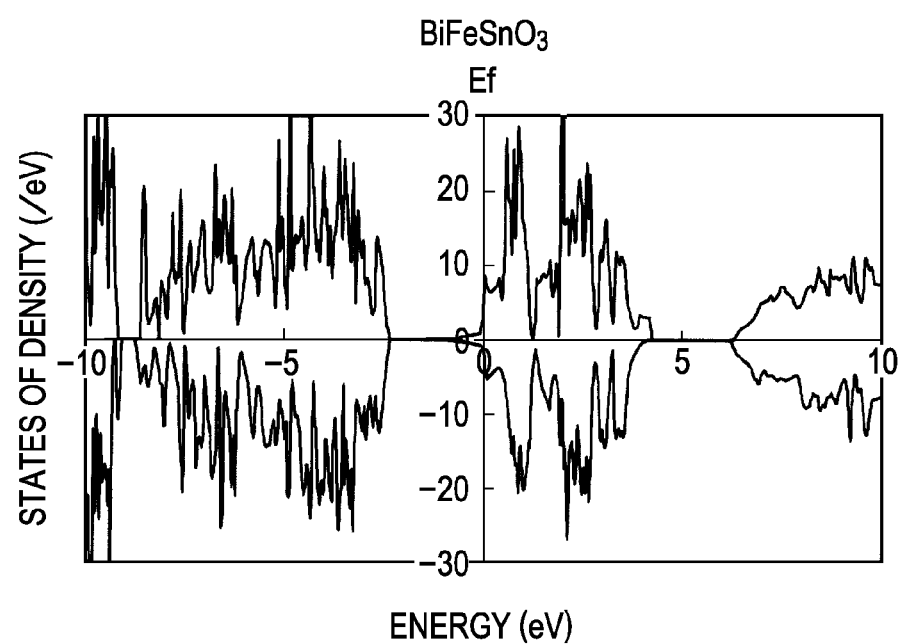
FIG. 19 is a diagram illustrating an electron density of a state when 12.5% of Fe in B sites in $BiFeO_3$ is replaced with Sn.

A schematic diagram of the transition metal compound of the invention which has been doped (co-doped) with an n-type dopant element and a p-type dopant element at the same time in this manner is shown in FIG. 10. As shown in this diagram, when a complex oxide which is a transition metal compound such as $BiFeO_3$ is doped (co-doped) with an n-type dopant element and a p-type dopant element at the same time, the p-type deficiency is cancelled out by the n-type dopant element and the n-type deficiency is cancelled out by the p-type dopant element. As a result, it is possible to considerably reduce leak current which is generated as hopping conductance between the p-type deficiencies and leak current which is generated as hopping conductance between the n-type deficiencies.

That is, specifically, for example, in the invention, $BiFeO_3$ is doped with a first dopant element which is at least one type selected from a group formed from sodium (Na), potassium (K), calcium (Ca), and strontium (Sr), and a second dopant element which is at least one type selected from a group formed from manganese (Mn), titanium (Ti), vanadium (V), niobium (Nb), and tin (Sn) at the same time.

Here, the first dopant element replaces at the A site and the second dopant element replaces at the B site, the first dopant element is a p-type donor and cancels out the n-type deficiency, and the second dopant element is a n-type donor and cancels out the p-type deficiency.

FIGS. 11 to 19 are diagrams illustrating electron density of a state which is determined using an electron state calculation from first principles respectively with regard to each crystal where 12.5% of Bi at the A site is replaced with sodium (Na), potassium (K), calcium (Ca), or strontium (Sr) and 12.5% of Fe at the B site is replaced with manganese (Mn), titanium (Ti), vanadium (V), niobium (Nb), or tin (Sn). Here, the conditions of the electron state calculation from first principles is the same as described above.

As shown in FIGS. 11 to 14, when a portion of the bismuth (Bi) in $BiFeO_3$ is forcibly replaced with sodium (Na), potassium (K), calcium (Ca), or strontium (Sr) which are the first dopant elements, an empty state density appears to the positive side of the energy 0 eV. That is, the maximum electron occupation level enters the valence band energy region. Accordingly, in the system, it is understood that there is no insulation, hole carriers are generated, and there is a p-type as the dopant element. At this time, by determining the area of the empty state density, it is understood that the first dopant element with regard to the A site gives the hole carriers below. That is, two hole carriers are given in the case of Na and K. In addition, one hole carrier is respectively given in the case of Ca and Sr. Due to this, it is understood that each of the elements of sodium (Na), potassium (K), calcium (Ca), and strontium (Sr) works as a p-type donor.

In addition, as shown in FIGS. 15 to 19, when a portion of the iron (Fe) in $BiFeO_3$ is forcibly replaced with manganese (Mn), titanium (Ti), vanadium (V), niobium (Nb), or tin (Sn) which are the second dopant elements, a state density in which there is more occupation to the negative side than 0 eV appears. That is, the maximum electron occupation level enters the conduction band energy region. Accordingly, in the system, it is understood that there is no insulation, hole carriers are generated, and there is an n-type as the dopant element. At this time, one hole carrier is given in the case of Mn, Ti, and Sn. In addition, two hole carriers are respectively given in the case of V and Nb. Due to this, it is understood that each of the elements of manganese (Mn), titanium (Ti), vanadium (V), niobium (Nb), and tin (Sn) works as an n-type donor.

As described above, for example, in the invention, it is possible that, by doping $BiFeO_3$ with the first dopant element which is at least one type selected from the group formed from sodium (Na), potassium (K), calcium (Ca), and strontium (Sr), the n-type deficiency is cancelled out, and by doping with the second dopant element which is at least one type selected from the group formed from manganese (Mn), titanium (Ti), vanadium (V), niobium (Nb), and tin (Sn), the p-type deficiency is cancelled out, and as a result, it is possible to maintain high insulation.

Since two hole carriers are given to the system in the case of Na and K which are first dopant elements in the invention, it is possible to cancel out two electron carriers which generate the n-type deficiency. In addition, since one hole carrier is given to the system in the case of Ca and Sr which are first dopant elements in the invention, it is possible to cancel out one electron carrier which generates the n-type deficiency.

Furthermore, since one electron carrier is given to the system in a case of Mn, Ti, and Sn which are second dopant elements in the invention, it is possible to cancel out one hole carrier which generates the p-type deficiency. In addition, since two electron carriers are given to the system in the case of V and Nb which are second dopant elements in the invention, it is possible to cancel out two hole carriers which generate the p-type deficiency.

The first dopant element does not necessarily completely remove the bismuth deficiency itself by being positioned at the A site. That is, it is possible for atomic deficiency and the first dopant element at the A site to coexist. For example, even in a case where there is bismuth deficiency at the A site, the first dopant element does not necessarily enter a position where the bismuth has been removed, and the elements other than Bi or the like at the A site are replaced and doped with bismuth deficiency still existing. The first dopant element works to cancel out the bismuth deficiency (n-type) at the B site and the second dopant element works to cancel out the bismuth deficiency (p-type) at the A site.

Here, it is preferable that the first dopant element which is at least one type selected from the group formed from sodium (Na), potassium (K), calcium (Ca), and strontium (Sr) dopes with an amount which corresponds to the estimated n-type deficiency and the second dopant element which is at least one type selected from the group formed from manganese (Mn), titanium (Ti), vanadium (V), niobium (Nb), and tin (Sn) dopes with an amount which corresponds to the estimated p-type deficiency. As a result, for example, 10% or less, and preferably 5% or less is the appropriate amount of doping. Here, the first and the second dopant elements may be doped with one type or with two or more types at the same time.

The dopant elements such as these are classified with regard to the element which configures the perovskite structure which is the base and dope according to the amount of deficiency which are generated in the crystals.

In the invention, the complex oxide may include lanthanum which has a large ion radius at the A site. It is possible to suppress the appearance of heterogeneous phases other than the perovskite structure which includes lanthanum. Furthermore, since the covalent bond of lanthanum with the closest oxygen is considerably weaker compared to the case of bismuth, the potential barrier is lowered with regard to the rotation of the polarization moment due to an applied electric field. The state where rotation of the polarization moment easily occurs increases the piezoelectric characteristics. In addition, since lanthanum is a metal with an ionic valance of +3, there is no adverse effect on the leak current state without changing the "valence balance" of the invention even if this metal element exists at the A site. It is preferable that the occupancy proportion of lanthanum at the A site be equal to or more than 0.05 and equal to or less than 0.20 in the molar ratio of the total amount of bismuth and lanthanum. Since praseodymium, neodymium, and samarium are also elements with large ion radiuses which have an ionic valance of +3, there is the same effect as lanthanum.

In addition, the complex oxide may include either or both of cobalt (Co) and chromium (Cr) along with iron (Fe) at the B site. It is preferable that these elements be included to be equal to or more than 0.125 and equal to or less than 0.875 in the molar ratio of the total amount of the elements at the B site. In this manner, it is possible that insulation and magnetization are maintained by the complex oxide including cobalt and chromium with iron at a position in the B site in a predetermined proportion. In addition, since this complex oxide has a morphotoropic phase boundary (MPB), superior piezoelectric characteristics are possible. In particular, for example, the piezoelectric constant and the like are large due to the MPB and the piezoelectric characteristics are particularly superior in the vicinity of a molar ratio of cobalt or chromium of 0.5 with regard to the total amount of iron and cobalt or chromium.

Furthermore, it is preferable that the complex oxide further includes barium titanate with a stoichiometric composition (for example, $BaTiO_3$ with a perovskite structure) in addition to $BiFeO_3$. In this case, an MPB appears between $BiFeO_3$ with a rhombohedral structure and $BaTiO_3$ with a tetragonal structure at room temperature. The approximate composition ratio where the MPB appears is 3:1 with $BiFeO_3$:$BaTiO_3$. As a result, the piezoelectric characteristics of the piezoelectric layer 70 are excellent in the composition and it is possible for the vibrating plate to significantly change position using a small voltage. Here, in the case where the piezoelectric layer 70 includes barium titanate, for example, the first dopant element and the second dopant element dope the complex oxide (for example, $(Bi, Ba)(Fe, Ti)O_3$) with the perovskite structure, which is formed by barium titanate and bismuth ferrate which is the main component, at the same time.

The piezoelectric layer 70 of the embodiment has a crystalline structure with a monoclinic system. That is, the piezoelectric layer 70 which is formed from the complex oxide which has a perovskite structure has monoclinic symmetry. It is possible for the piezoelectric layer 70 such as this to obtain strong piezoelectric characteristics. As a reason for this, it is thought that there is a configuration where the polarization moment of the piezoelectric layer is easily rotated with regard to an applied electric field which is applied to the surface in a perpendicular direction. In the piezoelectric layer, the amount of change in the polarization moment and the amount of deforming of the crystalline structure are directly coupled and it is these that form the piezoelectric characteristics. Due to the above, it is possible to obtain strong piezoelectric characteristics in a configuration where it is easy for a change in polarization moment to occur.

In addition, it is preferable that the piezoelectric layer 70 be an engineered domain arrangement where the polarization direction is inclined with a predetermined angle (50 degrees to 60 degrees) with regard to the film surface perpendicular direction (thickness direction of the piezoelectric layer 70).

The crystalline orientation direction of the piezoelectric layer 70 may be any of the (100) orientation, the (111) orientation, and the (110) orientation, or a structure which is a mixture of these as long as the conditions of the polarization direction of the engineered domain are satisfied.

In each of the second electrodes 80 which are individual electrode of the piezoelectric element 300, a lead electrode 90 formed from, for example, gold (Au) or the like, which is drawn out from a vicinity of an edge portion on the ink supply path 14 side and extends to above the elastic film 50 or the insulation film which is provided as required, is connected.

On the flow path forming substrate 10 where the piezoelectric element 300 is formed, that is, on the first electrode 60, the elastic film 50, the insulation film which is provided as required and the lead electrode 90, a protection substrate 30, which has the manifold section 31 which configures at least a portion of a manifold 100, is joined via the adhesion agent 35. The manifold section 31 is formed in the embodiment to penetrate the protection substrate 30 in the thickness direction and span in the width direction the pressure generating chambers 12, and the manifold 100 is configured to be an ink chamber which is common to each of the pressure generating chambers 12 by communicating with the communication section 13 of the flow path forming substrate 10 such as is described above. In addition, the communication section 13 of the flow path forming substrate 10 may be partitioned into a plurality for each of the pressure generating chambers 12 and only the manifold section 31 may be the manifold. Furthermore, for example, only the pressure generating chambers 12 may be provided in the flow path forming substrate 10 and the ink supply path 14 which communicates between the manifold 100 and each of the pressure generating chambers 12 may be provided in a member which interposes between the flow path forming substrate 10 and the protection substrate 30 (for example, the elastic film 50, the insulation film which is provided as required, and the like).

In addition, a piezoelectric element holding section 32 which has a space of the extent which does not impair the movement of the piezoelectric element 300 is provided in a region on the protection substrate 30 which opposes the piezoelectric element 300. It is sufficient if the piezoelectric element holding section 32 has a space of the extent which does not impair the movement of the piezoelectric element 300 and the space may be sealed or may not be sealed.

As the protection substrate 30, it is preferable to use a material with substantially the same thermal expansion coefficient as the flow path forming substrate 10, for example, glass, ceramics, or the like, and in the embodiment, the protection substrate 30 is formed using a silicon single crystal substrate which is the same material as the flow path forming substrate 10.

In addition, a through hole 33 which penetrates the protection substrate 30 in the thickness direction is provided in the protective substrate 30. Then, the vicinity in the edge portion of the lead electrode 90 which extends from each of the piezoelectric elements 30 is provided so as to be exposed by the through hole 33.

In addition, a driving circuit 120 for driving the piezoelectric elements 300 which are lined up is fixed on the protection substrate 30. It is possible to use, for example, a circuit substrate, a semiconductor integrated circuit (IC), or the like as the driving circuit 120. Then, the driving circuit 120 and the lead electrode 90 are electrically connected via a connection wire 121 which is formed from a conductive wire such as a bonding wire.

In addition, a compliance substrate 40, which is formed from a sealing film 41 and a fixing substrate 42, is joined onto the protection substrate 30. Here, the sealing film 41 is formed from a material which has low rigidity and high flexibility, and one surface of the manifold section 31 is sealed using the sealing film 41. In addition, the fixing substrate 42 is formed using a material which is relatively hard. Since a region on the fixing substrate 42 which opposes the manifold 100 is an opening section 43 which is completely removed in the thickness direction, one surface of the manifold 100 is sealed on by the sealing film 41 which has flexibility.

In an ink jet recording head I of the embodiment, after ink is input from an ink introduction port which is connected with an external ink supply means which is not shown and an inner portion from the manifold 100 to the nozzle opening 21 is filled with ink, the pressure in each of the pressure generating chambers 12 is increased and ink droplets are discharged from the nozzle opening 21 by a voltage being applied between each of the first electrode 60 and the second electrode 80 which correspond to the pressure generating chambers 12 in accordance with a recording signal from the driving circuit 120 and the elastic film 50, the adhesive layer 56, the first electrode 60, and the piezoelectric layer 70 being deflected.

Next, one example of a manufacturing method of the ink jet recording head of the embodiment will be described with reference to FIGS. 20A to 24B. Here, FIGS. 20A to 24B are cross-sectional diagrams in the longitudinal direction of the pressure generating chambers.

Figure 20A:
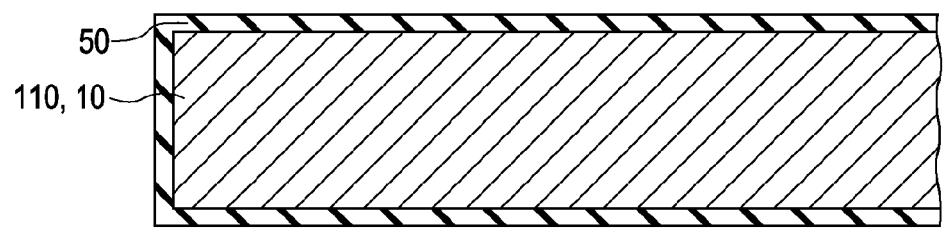
FIGS. 20A and 20B are cross-sectional diagrams illustrating a manufacturing process of a recording head according to the first embodiment.
Figure 20B:
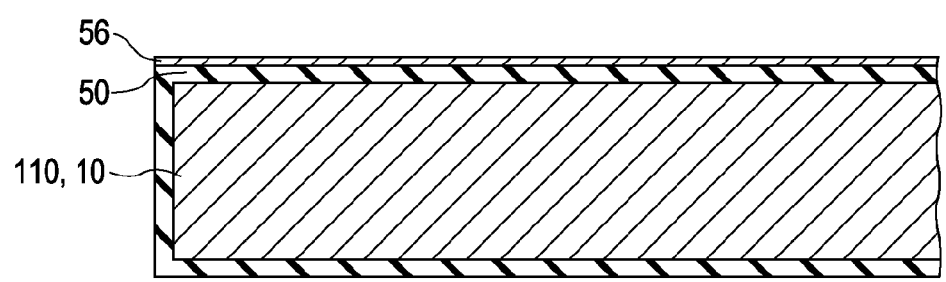

First, as shown in FIG. 20A, a silicon dioxide film formed from silicon dioxide ($SiO_2$) and the like which configures the elastic film 50 is formed on the surface on a flow path forming substrate wafer 110 which is a silicon wafer using thermal oxidation or the like. Next, as shown in FIG. 20B, the adhesive film 56 formed from titanium oxide or the like is formed on the elastic film 50 (silicon dioxide film) using a sputtering method, thermal oxidation, or the like.

Figure 21A:
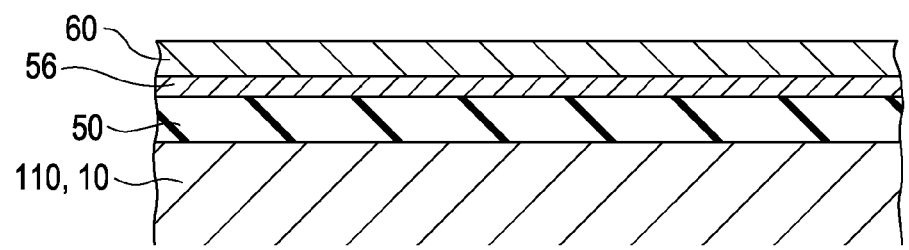
FIGS. 21A to 21C are cross-sectional diagrams illustrating a manufacturing process of a recording head according to the first embodiment.

Next, as shown in FIG. 21A, a platinum film which configures the first electrode 60 is formed on the adhesive layer 56 over the whole surface using a sputtering method or the like.

Next, the piezoelectric layer 70 is laminated on the platinum film. The piezoelectric layer 70 is able to be formed using a chemical solution method such as a MOD (Metal-Organic Decomposition) method or a sol-gel method where a piezoelectric layer (piezoelectric film) formed from a metal oxide is obtained by a solution which includes a metal complex being coated and dried and being baked at a high temperature or a gas phase method such as sputtering. Here, other than this, the piezoelectric layer 70 may also be formed using a laser ablation method, a sputtering method, a pulse laser deposition method (PLD method), a CVD method, an aerosol deposition method, or the like.

Figure 21B:
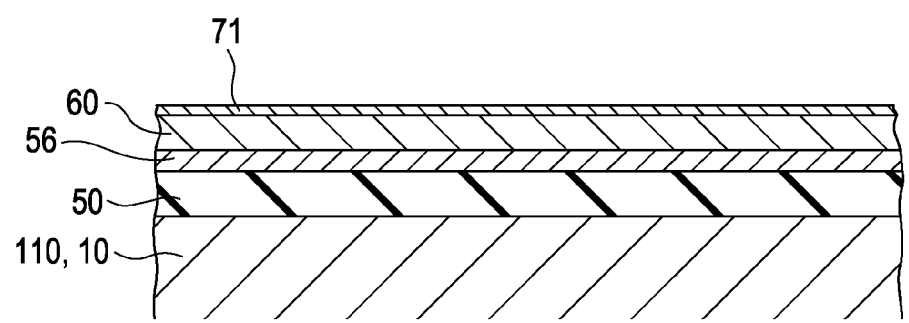

As a specific formation sequence example of the piezoelectric layer 70, first, as shown in FIG. 21B, a piezoelectric precursor film 71 is formed (coating process) by a sol or a MOD solution (precursor solution) which includes a metal complex, specifically, a metal complex which contains Bi and Fe, La, Co, and Cr which are contained if required, and the first dopant element and the second dopant element, being coated on the first electrode 60 in a proportion which is the target composition ratio using a spin coating method or the like.

The precursor solution for coating is where a metal complex which is able to form a complex oxide which includes Bi and Fe, La, Co, and Cr which are contained if required, and the first dopant element and the second dopant element are mixed so that each of the metals is in a predetermined molar ratio and this mixture is dissolved or dispersed using an organic solvent such as an alcohol.

Here, "a metal complex which is able to form a complex oxide which includes Bi and Fe, La, Co, and Cr which are contained if required, and the first dopant element and the second dopant element" indicates a mixture of metal complexes which include metals or one or more types of Bi and Fe, La, Co, and Cr which are contained if required, and the first dopant element and the second dopant element. As the metal complexes which respectively include Bi and Fe, La, Co, and Cr which are contained if required, and the first dopant element and the second dopant element, for example, it is possible to use a metal acetylacetonate, an organic salt, or a β diketone complex and the like.

As the metal complex which includes Bi, for example, there is bismuth 2-ethylhexanoate and the like. As the metal complex which includes Fe, for example, there is iron 2-ethylhexanoate and the like. As the metal complex which includes Co, for example, there is cobalt 2-ethylhexanoate and the like. As the metal complex which includes Cr, for example, there is chromium 2-ethylhexanoate and the like. As the metal complex which includes La, for example, there is lanthanum 2-ethylhexanoate and the like. As the metal complex which includes Na, for example, there is sodium 2-ethylhexanoate, sodium acetate, sodium acetylacetonate, sodium tert-butoxide, and the like. As the metal complex which includes K, for example, there is potassium 2-ethylhexanoate, potassium acetate, potassium acetylacetonate, potassium tert-butoxide, and the like. As the metal complex which includes Ca, for example, there is calcium 2-ethylhexanoate and the like. As the metal complex which includes Sr, for example, there is strontium 2-ethylhexanoate and the like. As the metal complex which includes Mn, for example, there is manganese 2-ethylhexanoate and the like. As the metal complex which includes Ti, for example, there is titanium 2-ethylhexanoate and the like. As the metal complex which includes V, for example, there is vanadium 2-ethylhexanoate and the like. As the metal complex which includes Nb, for example, there is niobium 2-ethylhexanoate and the like. As the metal complex which includes Sn, for example, there is tin 2-ethylhexanoate and the like. Here, of course, a metal complex which includes two or more types out of the elements of Bi, Fe, Co, La, and the like may be used.

Next, the piezoelectric precursor film 71 is heated to a predetermined temperature (150 to 400° C.) and is dried for a certain period of time (drying process). Next, the dried piezoelectric precursor film 71 is cleaned by being heated to and maintained at a predetermined temperature for a certain period of time (cleaning process). Here, cleaning referred to here is the separation of organic compounds which are included in the piezoelectric precursor film 71 as, for example, $NO_2$, $CO_2$, $H_2O$, and the like. The atmosphere in the drying process and the cleaning process is not limited and may be air or an inert gas.

Figure 21C:
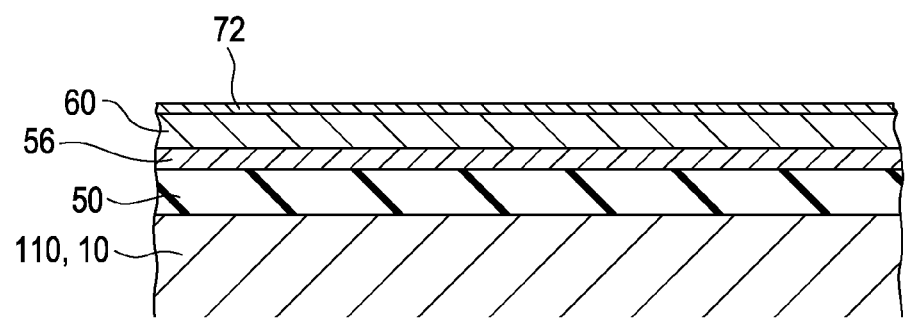

Next, as shown in FIG. 21C, the piezoelectric precursor film 71 is crystallized by being heated to and maintained at a predetermined temperature of, for example, approximately 600 to 800° C. for a certain period of time and a piezoelectric film 72 is formed (baking process). Also in the baking process, the atmosphere not limited and may be air or an inert gas.

Here, as a heating device used in the drying process, the cleaning process, and the baking process, for example, there is an RTA (Rapid Thermal Annealing) device which heats using irradiation of an infrared lamp, a hot plate, or the like.

Figure 22A:
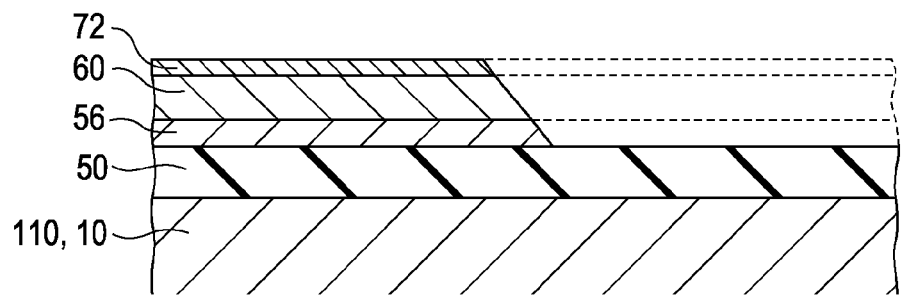
FIGS. 22A and 22B are cross-sectional diagrams illustrating a manufacturing process of a recording head according to the first embodiment.

Next, as shown in FIG. 22A, the first electrode 60 and the first layer of the piezoelectric film 72 are patterned at the same time so that the side surfaces thereof are inclined with a resist (not shown) with a predetermined shape on the piezoelectric film 72 as a mask.

Figure 22B:
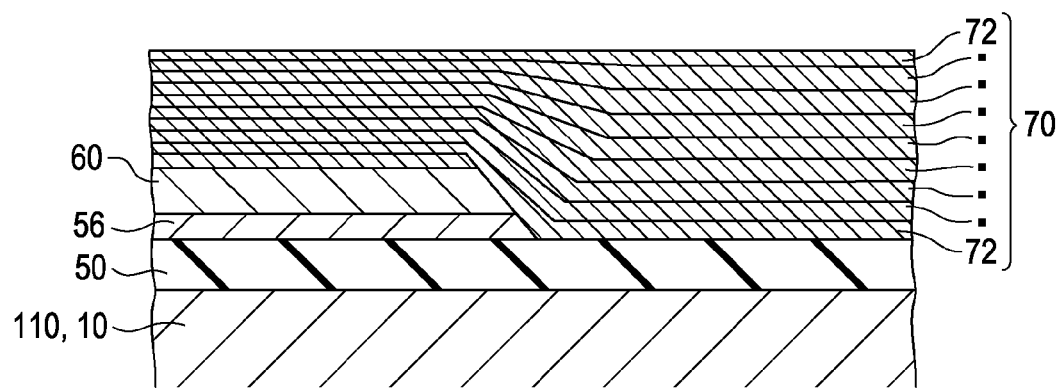

Next, after the resist is removed, the piezoelectric layer 70 is formed with a predetermined thickness from a plurality of layers of the piezoelectric film 72 as shown in FIG. 22B by forming the piezoelectric layer 70 from a plurality of piezoelectric films 72 due to repeating the coating process, the drying process, and the cleaning process, or the coating process, the drying process, the cleaning process, and the baking process a plurality of times according to a predetermined film thickness or the like. For example, in a case where the film thickness of one coating solution is approximately 0.1 μm, the film thickness of the entire piezoelectric layer 70 which is formed from 10 layers of the piezoelectric film 72 is approximately 1.1 μm. Here, the piezoelectric film 72 is provided as a laminate in the embodiment, but may be only one layer.

Figure 23A:
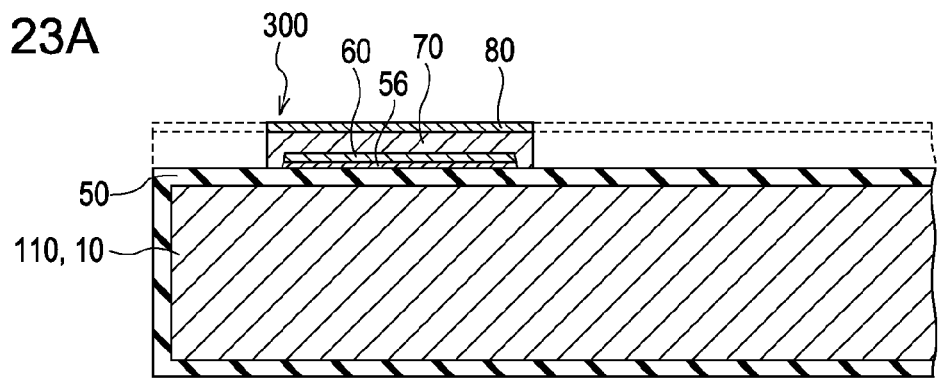
FIGS. 23A to 23C are cross-sectional diagrams illustrating a manufacturing process of a recording head according to the first embodiment.

After the piezoelectric layer 70 is formed in this manner, as shown in FIG. 23A, the second electrode 80 formed from platinum or the like is formed on the piezoelectric layer 70 using a sputtering method or the like and a piezoelectric element 300 formed from the first electrode 60, the piezoelectric layer 70, and the second electrode 80 is formed by the piezoelectric layer 70 and the second electrode 80 being patterned at the same time in a region which opposes each of the pressure generating chambers 12. Here, it is possible for the patterning of the piezoelectric layer 70 and the second electrode 80 to be performed together using dry etching via a resist (not shown) which is formed with a predetermined shape. After that, post annealing may be performed at a temperature in the region of 600 to 800° C. as required. Due to this, it is possible to form an excellent interface between the piezoelectric layer 70 and the first electrode 60 and the second electrode 80 and it is possible to improve the crystalline characteristics of the piezoelectric layer 70.

Figure 23B:
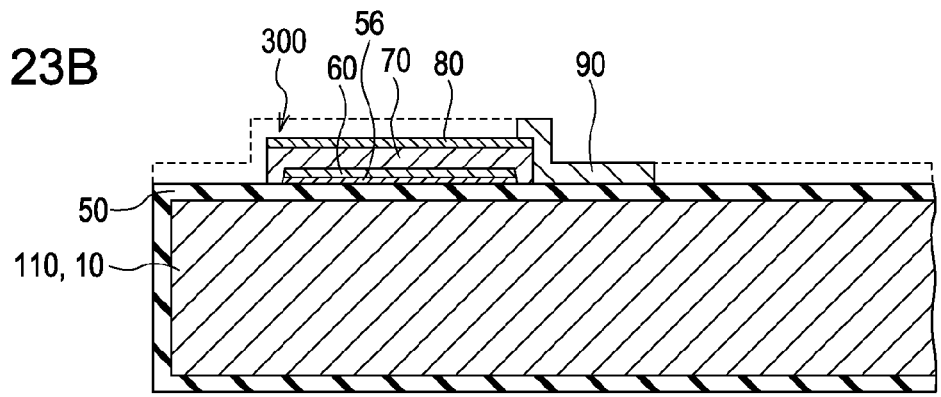

Next, as shown in FIG. 23B, for example, after the lead electrode 90 formed from gold (Au) or the like is formed over the entire surface of the flow path forming substrate wafer 110, for example, patterning is performed for each of the piezoelectric elements 300 via a mask pattern (not shown) which is formed from a resist or the like.

Figure 23C:
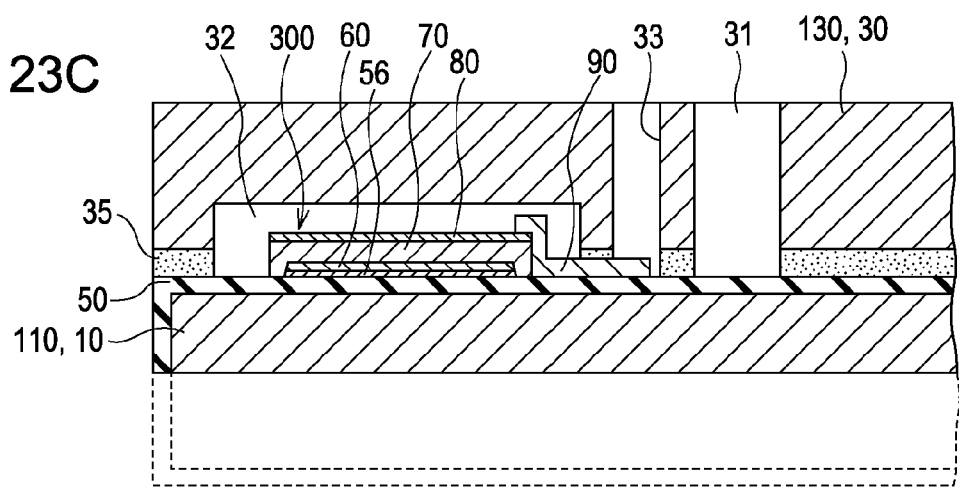

Next, as shown in FIG. 23C, after a protection substrate wafer 130 which is a silicon wafer and becomes a plurality of the protection substrates 30 is joined to the piezoelectric element 300 side of the flow path forming substrate wafer 110 via the adhesive agent 35, the flow path forming substrate wafer 110 is thinned to a predetermined thickness.

Figure 24A:
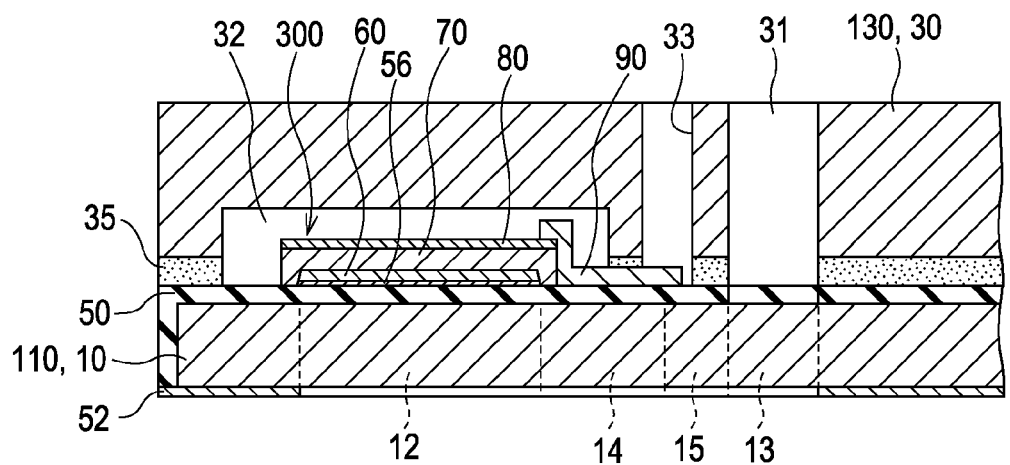
FIGS. 24A and 24B are cross-sectional diagrams illustrating a manufacturing process of a recording head according to the first embodiment.

Next, as shown in FIG. 24A, a mask film 52 is newly formed on the flow path forming substrate wafer 110 and is patterned into a predetermined shape.

Figure 24B:
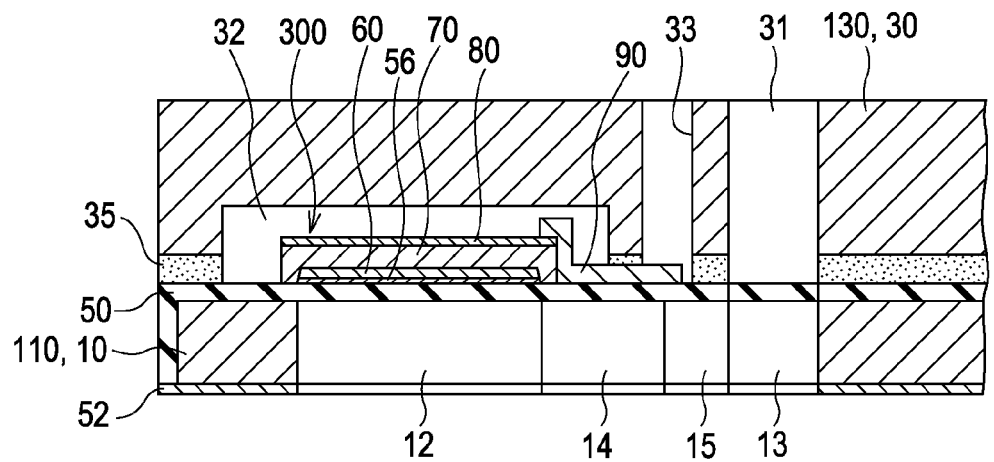

Next, as shown in FIG. 24B, the pressure generating chamber 12, the communication section 13, the ink supply path 14, the communication path 15, and the like which correspond to the piezoelectric element 300 are formed by performing anisotropic etching (wet etching) on the flow path forming substrate wafer 110 using an alkaline solution such as KOH via the mask film 52.

After this, the unnecessary portions of the periphery edge portions of the flow path forming substrate wafer 110 and the protection substrate wafer 130 are removed by, for example, cutting using dicing or the like. Then, the nozzle plate 20 which is provided with the nozzle opening 21 is joined to the surface of the flow path forming substrate wafer 110 on the side opposite to the protection substrate wafer 130 after the mask film 52 is removed, the compliance substrate 40 is joined to the protection substrate wafer 130, and by dividing up the flow path forming substrate wafer 110 and the like into the flow path forming substrates 10 and the like with a one chip size shown in FIG. 1, there is the ink jet recording head I of the embodiment.

EXAMPLE

Below, an example is displayed and the invention will be described more specifically. Here, the invention is not limited to the example described below.

Example

First, a silicon oxide ($SiO_2$) film with a thickness of 1170 nm was formed on the surface of (100) single crystal silicon (Si) using a heat treatment. Next, a titanium film with a thickness of 40 nm was formed on the $SiO_2$ film using a RF magnetron sputtering method and a titanium oxide film was formed by heat oxidation. Next, a platinum film (the first electrode 60) with a thickness of 130 nm which is orientated with a (111) surface was formed on the titanium oxide film using a RF magnetron sputtering method.

Next, a piezoelectric layer was formed on the first electrode 60 using a sputtering method and this is the piezoelectric layer 70. The method was as below. A precursor solution was prepared where a first solution where each of the n-octane solutions of bismuth 2-ethylhexoate, iron 2-ethylhexoate, manganese 2-ethylhexoate, barium 2-ethylhexoate, and titanium 2-ethylhexoate were mixed so that the molar ratio of each element in Bi:Ba:Fe:Ti:Mn=77.5:22.5:73.625:22.5:3.875 and a second solution which is a butanol solution where organic metal compounds of bismuth, sodium, and titanium are dissolved so that Bi:Na:Ti=50:50:100 were mixed so that the molar of the first solution:the molar of the second solution=90:10 by calculating with molar which are perovskite.

There, the precursor solution was dripped onto the substrate where the first electrode 60 was formed and a piezoelectric precursor film was formed by the substrate being rotated at 3000 rpm (coating process). Next, there was drying for 2 minutes at 180° C. on a hot plate (drying process). Next, degreasing was performed for 2 minutes at 350° C. (degreasing process). After the processes of the coating process, the drying process, and the degreasing process are repeated 7 times, baking was performed for 5 minutes at 750° C. with a RTA (Rapid Thermal Annealing) device in an oxygen atmosphere (baking process). Then, the piezoelectric layer 70 was formed with a thickness of 530 nm over its entirety.

After that, after a platinum film (the second electrode 80) with a thickness of 100 nm was formed as the second electrode 80 on the piezoelectric layer 70 using a sputtering method, the piezoelectric element 300 with the piezoelectric layer 70 as a complex oxide which has a perovskite structure which includes Bi, Fe, Mn, Ba, and Ti was formed due to baking being performed for 5 minutes at 750° C. with a RTA device in an oxygen atmosphere.

The piezoelectric layer 70 has a composition of mixed crystals of 75 BFM ($BiFe_{0.95}Mn_{0.05}O_3$)-15 BT ($BiTiO_3$) -10 BNT ($Bi_{0.5}Na_{0.5}TiO_3$), Na is doped in A site and Mn is doped at the B site, and is 85 ($Bi_{0.94}Na_{0.06}Fe_{0.84}Mn_{0.04}Ti_{0.12}O_3$)-15 BT ($BiTiO_3$) when represented by a formula.

Experimental Example 1

With regard to the piezoelectric element of the example, the relationship between the applied voltage and the current density was measured at room temperature using "4140B" which is manufactured by Hewlett-Packard Company. The current density was measured with applied voltages of +30 V and −30 V each in two points, and as a result of measuring the current density at an applied voltage of 30 V from the average of the four points, it was $1.39 \times 10^{-3}$ $A/cm^2$.

As a comparison, as a result of the Mn and Na not being doped and the current density being measured in the same manner with regard to 85 BFO ($BiFeO_3$)-15 BT ($BiTiO_3$), it was not possible to make a short occur and to measure the current density. Accordingly, the leak resistant characteristics are improved using Mn and Na doping.

Other Embodiments

Above, one embodiment of the invention has been described, but the basic configuration of the invention is not limited to that described above. For example, in the embodiment described above, a silicon single crystal substrate is shown as an example of the flow path forming substrate 10, but the invention is not particularly limited to this, and for example, material such as a SOI substrate, glass, or the like may be used.

Furthermore, in the embodiment described above, the piezoelectric element 300 where the first electrode 60, the piezoelectric layer 70, and the second electrode 80 are sequentially laminated on the substrate (flow path forming substrate 10) is shown as an example, but the invention is not particularly limited to this, and for example, it is possible to apply the invention also to a piezoelectric element of a vertical vibration type which extends and contracts in an axial direction by a piezoelectric material and an electrode forming material being alternately laminated.

Figure 25:
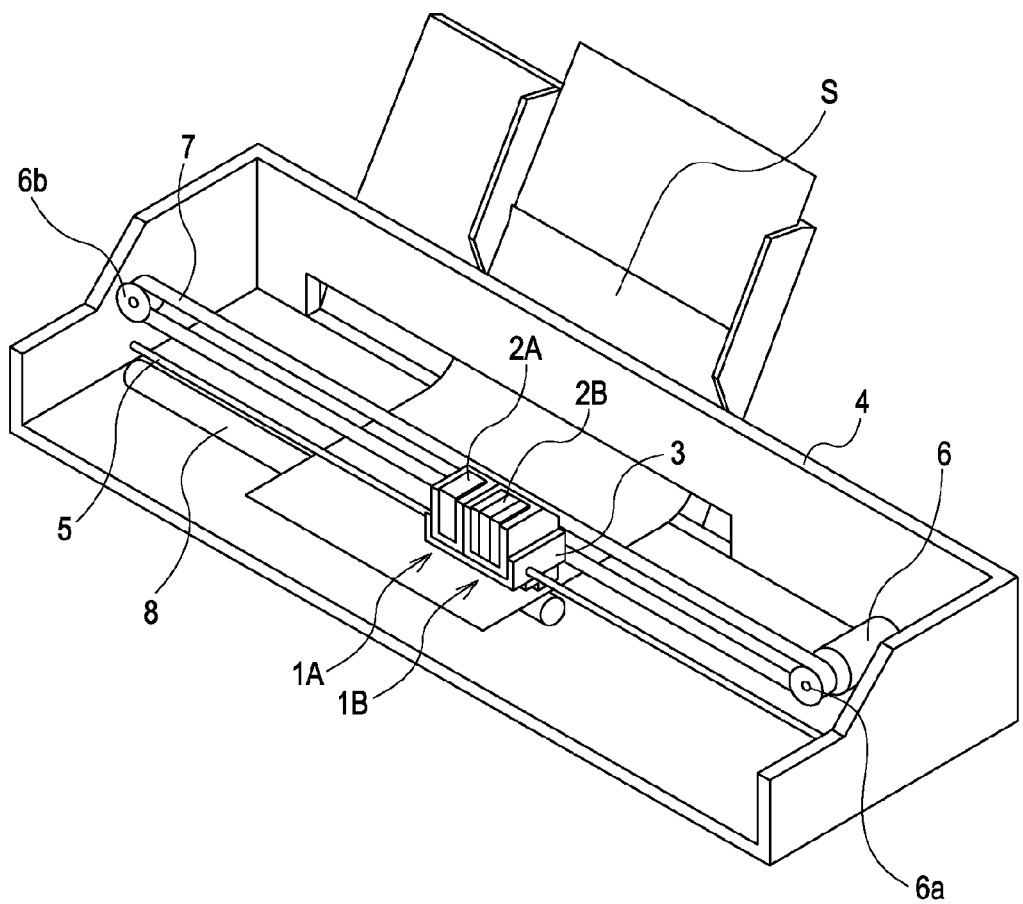
FIG. 25 is a diagram illustrating an outline configuration of a recording device according to the first embodiment of the invention.

In addition, the ink jet recording head of the embodiment configures a portion of the recording head unit which is mounted with an ink flow path which communicates with the ink cartridge and the like and is mounted in an ink jet recording device. FIG. 25 is an outline diagram illustrating one example of the ink jet recording device.

As shown in FIG. 25, in ink jet recording head units 1A and 1B which have the ink jet recording head I, cartridges 2A and 2B which configure ink supply means are provided to be able to be attached and detached, and a carriage 3 with the recording head units 1A and 1B mounted thereon is provided to be able to freely move in an axial direction on a carriage shaft 5 attached to an apparatus body 4. The recording head units 1A and 1B each discharge, for example, a black ink composition and a color ink composition.

In addition, by transferring the driving force of a driving motor 6 to the carriage 3 via a plurality of gears (not shown) and a timing belt 7, the carriage 3 with the recording head units 1A and 1B mounted thereon is moved along the carriage shaft 5. On the other hand, in the apparatus body 4, a platen 8 is provided along the carriage shaft 5, and a recording sheet S, which is a recording medium such as paper or the like fed by a feeding roller or the like (not shown), is transported by being wound on the platen 8.

In the example shown in FIG. 25, the ink jet recording head units 1A and 1B each have one of the ink jet recording heads I, but the invention is not particularly limited to this, and for example, one of the ink jet recording head units 1A or 1B may have two or more ink jet recording heads.

Here, in the embodiment described above, description is made with the ink jet recording head used as an example of a liquid ejecting head. However, the invention targets all types of liquid ejecting heads and of course can also be applied to liquid ejecting heads which eject a liquid other than ink. As other liquid ejecting heads, for example, there are various types of recording heads used in image recording apparatuses such as printers and the like, coloring material ejecting heads used in the manufacturing of color filters for liquid crystal displays and the like, electrode material ejecting heads used in forming electrodes for organic EL displays, FEDs (field emission displays) and the like, bioorganic material ejecting heads used in manufacturing biochips, and the like.

Since the piezoelectric element of the invention exhibits excellent insulation and piezoelectric characteristics, as described above, it is able to be applied to as a piezoelectric element of a liquid ejecting head which is represented by an ink jet recording head, but the invention is not limited to this. For example, it is possible to be applied in the same manner to a piezoelectric element in an ultrasonic device such as an ultrasonic transmitter, an ultrasonic motor, a piezoelectric transformer, and various sensors such as an infrared sensor, an ultrasound sensor, a heat sensor, a pressure sensor, and a pyroelectric sensor, and the like. In addition, the invention is also able to be applied in the same manner to a ferroelectric element such as ferroelectric memory.

What is claimed is:

1. A piezoelectric element comprising:
a piezoelectric layer; and
an electrode which is provided with the piezoelectric layer,
wherein the piezoelectric layer comprises a complex oxide which has a perovskite structure including:
bismuth;
iron;
a first dopant element which is at least one type selected from a group formed from sodium, potassium, calcium, and strontium; and
a second dopant element which is at least one type selected from a group formed from manganese, titanium, vanadium, niobium, and tin,
wherein the bismuth and the first dopant element are included in an A site and the iron and the second dopant element are included in a B site,
wherein the complex oxide has a deficiency in the A sites of the perovskite structure and has bismuth in the B sites.

2. The piezoelectric element according to claim 1,
wherein the complex oxide further includes barium titanate in addition to bismuth and iron.

3. A liquid ejecting head comprising:
the piezoelectric element according to claim 1.

4. A liquid ejecting apparatus comprising:
the liquid ejecting head according to claim 3.

* * * * *